US009444487B1

United States Patent
Dempsey

(10) Patent No.: US 9,444,487 B1
(45) Date of Patent: Sep. 13, 2016

(54) MULTIPLE STAGE DIGITAL TO ANALOG CONVERTER

(71) Applicant: ANALOG DEVICES GLOBAL, Hamilton (BM)

(72) Inventor: Dennis A. Dempsey, County Tipperary (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/838,097

(22) Filed: Aug. 27, 2015

(51) Int. Cl.
*H03M 1/38* (2006.01)
*H03M 1/78* (2006.01)
*H03M 1/68* (2006.01)

(52) U.S. Cl.
CPC ............. *H03M 1/785* (2013.01); *H03M 1/682* (2013.01)

(58) Field of Classification Search
CPC .......... H03M 1/00; H03M 1/06; H03M 1/66; H03M 1/68; H03M 1/1038; H03M 1/682; H03M 1/1061; H03M 1/765; H03M 1/662
USPC ................................................. 341/130–144
See application file for complete search history.

(56) References Cited

U.S. PATENT DOCUMENTS

| 5,554,986 | A | * | 9/1996 | Neidorff | ............... | H03M 1/682 |
| | | | | | | 341/145 |
| 5,969,657 | A | | 10/1999 | Dempsey | | |
| 6,037,889 | A | * | 3/2000 | Knee | ................... | H03M 1/0612 |
| | | | | | | 341/144 |
| 7,136,002 | B2 | | 11/2006 | Dempsey | | |
| 9,065,479 | B2 | * | 6/2015 | Dempsey | ................ | H03M 1/68 |
| 9,124,296 | B2 | * | 9/2015 | Dempsey | ................ | H03M 1/66 |

FOREIGN PATENT DOCUMENTS

WO     2014/140307     9/2014

\* cited by examiner

*Primary Examiner* — Lam T Mai
(74) *Attorney, Agent, or Firm* — Patent Capital Group

(57) ABSTRACT

In an example, there is disclosed a multi-stage Digital to Analog Convertor, including: a first stage having a first set of circuit components, a second stage having a second set of circuit components and a third stage having a third set of circuit components, the third stage providing a load within first and second individual switchable impedance paths; wherein the DAC is operable in each of a first mode, a second mode and a third mode of operation, wherein in a first mode the first stage is switchably coupled to the second stage independently of the third stage; in a second mode, the load is coupled and presented to a first part of the second stage of circuit components and in a third mode the load is coupled and presented to a second, different, part of the second stage of circuit components. A corresponding system and method is also disclosed.

26 Claims, 12 Drawing Sheets

MULTIPLE STAGE DIGITAL TO ANALOG CONVERTER

FIELD

The present application relates to a digital to analog converter (DAC) and particularly to a DAC implemented using multiple switched strings or stages. Such configurations are particularly suited for integrated circuit fabrication using, for example, MOS technology.

BACKGROUND

Digital to Analog Converters or DACs are well known in the art and are used to decode a digital input signal to a corresponding output analog signal. Examples of such DACs are described in co-assigned U.S. Pat. No. 5,969,657, the content of which is incorporated herein by way of reference.

Other known DAC configurations are described in co-assigned U.S. Pat. No. 7,136,002, again incorporated herein by way of reference, which describes a dual string DAC configuration implemented using a high impedance intermediate state.

Further known DAC configurations are described in co-assigned PCT/EP2014/055155, again incorporated herein by way of reference, which describes various multi-stage DAC circuits.

SUMMARY

There is provided in accordance with one aspect of the present teaching a multi-stage Digital to Analog Convertor (DAC) comprising a first stage comprising a first set of circuit components, a second stage comprising a second set of circuit components and a third stage comprising a third set of circuit components. The components of the third stage are arranged to selectively couple a load through first and second individual switchable impedance paths to first and second parts of the second stage. Using these circuit components the DAC is operable in each of a distinct first mode, a second mode and a third mode of operation. In a first mode the first stage is switchably coupled to the second stage independently of the third stage; in a second mode, the load is coupled and presented to a first part of the second stage of circuit components and in a third mode the load is coupled and presented to a second part of the second stage of circuit components.

It will be appreciated that where we describe the first stage being coupled to the second stage independently of the third stage, that there may be leakage or other finite conductive paths provided between the first stage and third stage that concurrently exist when the first stage is coupled to the second stage but these are relatively trivial in the context of the conductive path between the first and second stage and the contribution, and significance thereof, can be evaluated through use of simulation and the like, as will be appreciated by those of skill in the art. In this regard, the first stage can be considered as being switchably coupled substantially independently of the third stage.

In one aspect, a first one of the individual impedance paths comprises a first switchable variable resistor. In certain configurations, a second one of the individual impedance paths comprises a second switchable variable resistor. The first and second variable resistors may be the same devices or may be different devices. Where they are provided as different devices such that first and second switchable variable resistors are provided, each of the first and second switchable variable resistors may have substantially the same value. It will be appreciated that their ideal ranges can differ and hence they are not required to be the same but it can be advantageous for implementation to use the same value for both for circuit re-use and for the associated digital logic.

In one aspect, a first one of the individual impedance paths comprises a plurality of resistors that are individually switchable to define both Most Significant Bit, MSB, and Least Significant Bit, LSB transitions within the DAC.

The third stage may be configured to provide each of a high resolution path and a low resolution path from the first stage to an output of the DAC. By providing a third stage which may be coupled between each of the first and second stages, the third stage may be used in combination with the second stage to provide an LSB contribution to the overall DAC transfer function. It will be appreciated that the resolution of the DAC transfer function is related to the LSB contribution from the second stage. By reducing the resistance of the individual resistors R2 of the second stage relative to the resistance of the individual resistors R1 of the first stage, the size of the LSBs provided by the second stage will reduce. With this reduction in the size of the LSBs provided by the second stage, there is a corresponding need for a reduction in the LSBs provided by the third stage to maintain consistency in the DAC transfer function. This reduction in the third stage LSBs can be achieved by adding resolution to the third stage which has an overall effect of increasing the resolution of the DAC.

In this way, the third stage may comprise a programmable resistance network providing the plurality of individual switchable and complimentary impedance paths. Such a programmable resistance network may be digitally controlled.

Accordingly, a first embodiment of the application provides a DAC and a method of converting a digital input code to an analog equivalent as provided in accordance with the independent claims. Advantageous embodiments are provided in the dependent claims.

BRIEF DESCRIPTION OF THE DRAWINGS

The present application will now be described with reference to the accompanying drawings in which.

DETAILED DESCRIPTION OF THE DRAWINGS

Figure 1:
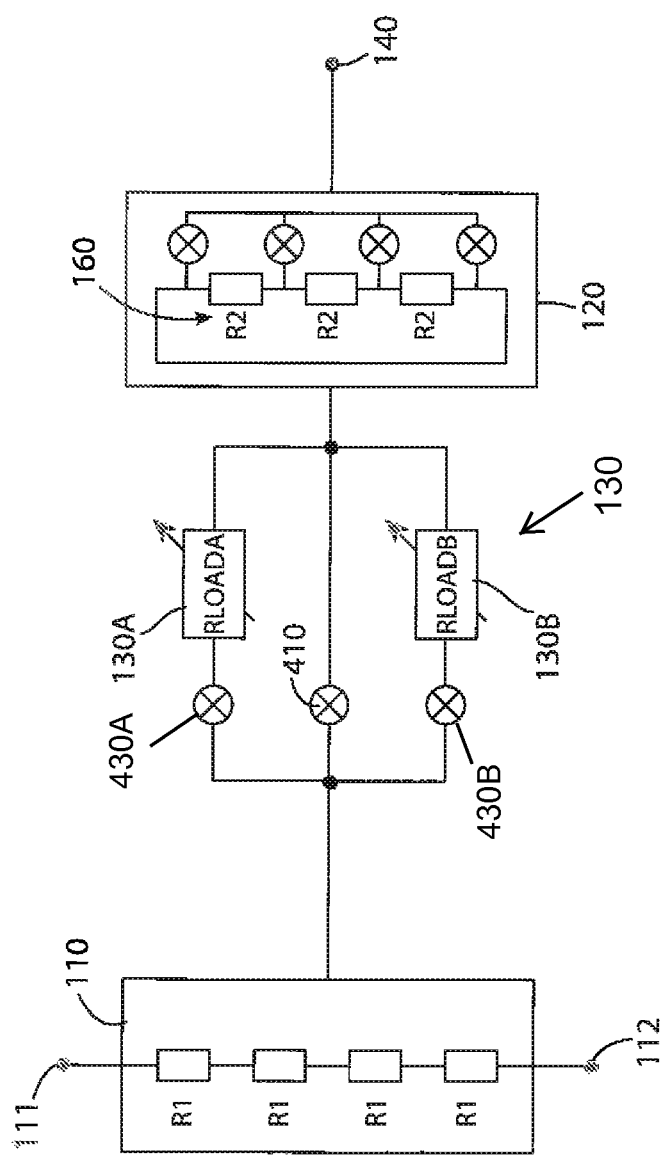
FIG. 1 is a block architecture schematic showing a DAC circuit provided in accordance with the present teaching.

The present teaching will now be described with reference to exemplary arrangements implemented in the form of a multi-string digital to analog converter, DAC. Digital to analog converters are used to convert an input digital signal to corresponding analog output. A DAC per the present teaching does not require a buffered architecture. Conventional DACs are implemented using a digital number transition arrangement but in accordance with the present teaching, there is no limiting requirement for binary transitions, although the circuits will be described in that context. Therefore where the present disclosure refers to MSB and LSB transitions, which are typically interpreted in the context of a binary state change reflecting specifics of a digital input code, within the context of the present teaching these should be interpreted more generally as state changes which do not necessarily represent a binary transition.

It will be appreciated that a multi-string DAC may also be considered a multi-stage DAC where each stage comprises a string of impedance elements. In such a multi-string converter, a first stage uses a first string for converting a group of higher order bits of an N-bit digital word and a second stage using a second string to decode the remaining, lower order bits. Within the context of the following, which is provided to assist the person of skill in an understanding of features and benefits of an arrangement in accordance with the present teaching, each of the strings will be described with reference to an exemplary implementation using resistors. It will be appreciated that resistors are an example of the type of impedance element that may be used and it is not intended to limit the present teaching to an implementation where resistors are used exclusively as impedance elements. In this regard it will be appreciated that resistors may be a preferred type of impedance element, particularly in scenarios where the voltage across the string is high—such as the string that is coupled to the reference terminals of the converter. In other strings where the voltage is relatively small, other elements such as active MOS devices may also be used. The present teaching should therefore not be construed as being limited to a multi-resistor string DAC.

The reference terminals are typically coupled to the first string and the following example illustrates a specific example of a voltage source. As will be appreciated by those skilled in the art the term voltage source is intended to define and include an active voltage supply, a voltage buffer or a current source which is coupled to other circuit elements and configured to provide a target voltage or indeed any other configuration of voltage sources/buffers/followers or circuit elements that are coupled to passive or active networks that could be implemented as a sub-part of a high-level circuit and the present teaching is not intended to be limited to any one specific implementation. Within this general definition it will be appreciated that the present teaching should not be limited to any one specific configuration and hence the use of the term reference terminal.

Furthermore within the context of the exemplary figures that follow, like or similar components that are described with reference to one Figure will be labelled with the same references in other Figures.

FIG. 1 shows an example in block schematic form of a multi-stage digital to analog converter, DAC, 100 provided in accordance with the present teaching. The DAC comprises a first DAC stage 110 with a plurality of impedance elements (shown in the schematic as impedance elements R1). The first stage which includes a first string 110 is coupled to reference terminals or nodes, in this specific example reference terminals provided by a voltage source at first 111 and second 112 reference nodes.

In the schematic of FIG. 1, these reference nodes are not detailed with any reference as to their being positive and negative voltage reference nodes as it will be appreciated that different potentials could be provided as required. The first string is configured to convert Most Significant Bits (MSBs) of a digital input signal and can therefore be considered as a MSB DAC string. As will be appreciated from the following, in certain configurations selected LSB codes can also be provided by selective and judicious switching of first string impedance elements, and the present teaching is not to be construed as being limited to only providing MSB switching from the first string. It will be therefore be understood from the following that, in accordance with the present teaching, judicious switching of at least one of the impedance elements of this first string may be used to provide an LSB transition at the output of the DAC. In this way the first stage should not be considered as exclusively providing a conversion of MSBs of the digital input word.

The DAC 100 also comprises a second set of circuit components which are configured to convert Least Significant Bits (LSBs) of a digital input signal and can therefore be considered as a LSB DAC block 120. This LSB DAC block 120 comprises a second string 160 of the DAC, the second string 160 comprising a plurality of impedance elements R2 and defines a second stage of the DAC. Individual ones of these impedance elements are coupled to individual switches which allow a selective switching of these impedance elements. It will be appreciated that the number of individual impedance elements will vary in the second string dependent on the overall DAC configuration and this exemplary arrangement of three individual resistors should be considered as purely exemplary of the number of impedance elements that may form the actual circuit. This LSB DAC block 120 is shown in this schematic as being switchably coupled to an output node 140 of the DAC but it will be appreciated that additional stages may be provided. As mentioned above, the second block or second stage is configured to convert Least Significant Bits (LSBs) of a digital input signal and can therefore be considered as a LSB DAC string, but again, as will be appreciated from the following, the present teaching is not to be construed as being limited to only providing LSB switching from this second string.

It will be appreciated that by using equal valued resistors for each of the unit resistors in the first 110 and second 120 stages, that this advantageously assists in providing a desirable linear solution for the conversion of digital input codes to corresponding analog values. It will be understood however that within the context of the present teaching that providing equal valued resistors is not essential within the context of the present teaching. It will also be appreciated that the number of resistors R1 provided in the first stage 110 is typically greater than the number of resistors R2 in the second stage 120 as these resistors are preferentially used to provide MSB transitions of the DAC transfer function. It will be appreciated that the values of the unit resistors R1 do not have to be equal to the values of the R2 resistors.

It will be appreciated that the resolution of the DAC transfer function is dependent on the LSB contribution provided by the second stage. As such, by reducing the resistance of the individual R2 resistors of this second stage 120 relative to the resistance of the individual R1 resistors of the first stage 110, the size of the LSBs provided by the second stage will reduce. To ensure that the overall consistency of the transfer function is maintained, the LSB contribution from the third stage becomes more significant. Maintenance of consistency of the DAC transfer function with R2 resistors having a reduced value may be achieved by increasing the resolution of the third stage to match or compensate for the reduction in the resolution contribution of the second stage.

As shown in FIG. 1, the DAC 100 further comprises a third stage 130 which may be considered as providing first and second switchable impedance paths to selected parts of the second stage 120. By switching either the first or second switchable parts to the second stage, a load is presented to the first stage 110 of the DAC 100.

Figure 3:
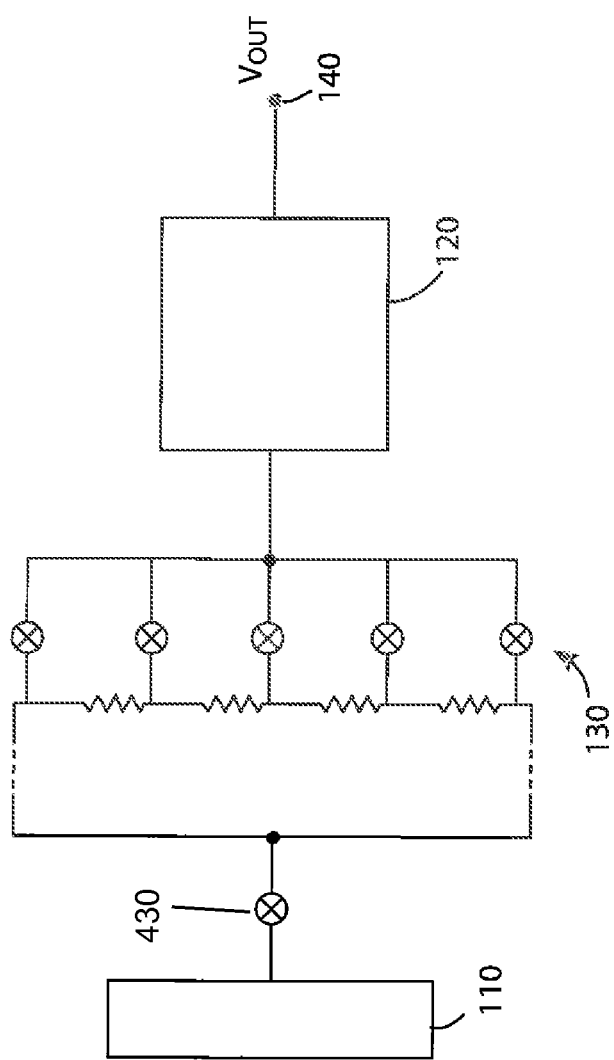
FIG. 3 is a block schematic showing examples of a switched resistor network that could be used to provide one of the first and second variable loads of FIG. 1.

In the arrangement of FIG. 1, the switchable paths comprise a first part 130A and a second part 130B. Each of the first part and the second part comprise a load—shown as RLOADA and RLOADB in FIG. 1 such that the third stage 130 (which is shown in FIG. 1 as comprising two constituents 130A, 130B) comprises a first load and a second load. By switching either the first load or second load into the circuit, each of the first and second loads 130A, 130B may be independently coupled to other components of the DAC architecture so as to selectively present that respective load to the first stage of the architecture. In this way, the first and second loads are coupled in a complimentary fashion to the other of the second and first loads. This may be effected by provided the individual parts 130A and 130B of the third stage as first and second individual switchable impedance paths provided between each of the first and second stages of the DAC. By judicious switching of these respective paths it is possible to provide the respective load of part 130A or 130B in series with the resistance of selected resistors from the first stage 110 of the DAC and with selected resistors from the second stage 120 of the DAC. The first and second loads may each comprise a variable load which may be provided by a variable resistor or other impedance elements to provide a plurality of individually switchable impedance elements that may be selectively coupled or switched to vary the overall load that is presented to the first set of circuit components 110, as shown in FIG. 3.

In the arrangement of FIG. 1, the plurality of individual switchable and complimentary impedance paths defined by the third stage are selectively activated such that when providing a load from the first part 130A of the third stage to the first stage 110, there is substantially no DC load provided by the second part 130B of the third stage to the same first stage. This may be configured by ensuring that when a first switchable impedance path defining a first path through the third set of circuit components is activated that a corresponding second path through the third set of circuit components is decoupled such that in a static state the first and second parts are not activated concurrently. It will be appreciated that certain transitions between the two paths may have instances where the two are activated but for the purposes of static operation, the present teaching provides one of two paths to be activated while the other of the two is deactivated.

In one aspect a first one of the individual complimentary impedance paths comprises a first switchable variable resistor. In certain configurations, a second one of the individual complimentary impedance paths comprises a second switchable variable resistor. The resistances of each of the first and second switchable variable resistors may be provided having the same resistance or have resistance ranges that overlap with one another.

In one aspect a first one of the individual complimentary impedance paths comprises a plurality of resistors that are individually switchable to define both Most Significant Bit, MSB, and Least Significant Bit, LSB transitions within the DAC.

The third stage may be configured to provide each of a high resolution path and a low resolution path from the first stage to an output of the DAC. This may be achieved by providing multi stage architectures which may comprise impedances that are coupled in series and/or in parallel. An example of an architecture that can be advantageously employed within the context of the present teaching to provide a parallel programmable resistance is that described in co-assigned application, U.S. application Ser. No. 14/823, 843 filed 11 Aug. 2015 the content of which is incorporated herein by way of reference. As described in that application, a programmble impedance may be provided by an architecture that provides an impedance value across two nodes in responsive to an input code word. The impedance is generated from a first branch which is coupled between the two nodes and is used in providing impedance values across a first range of the input code word and a second branch coupled between the two nodes and used in providing impedance values across a second range of the input code word. By using first and second branches to generate impedances for respective ranges of required operation, it is possible to obviate problems associated with switch resistances, leakage and speed in other known comparable programmable impedances which are designed to operate over an entire range of operation. This allows for a higher resolution, dynamic range than conventionally available.

In this way, the third stage may comprise a programmable resistance network providing the plurality of individual switchable and complimentary impedance paths. Such a programmable resistance network may be digitally controlled, and provided using a variable resistor in the form of a digital rheostat, a digital potentiometer or digiPOT. For the sake of completeness the following examples of digitally variable resistors which may be usefully deployed within the context of the present teaching are incorporated herein by way of reference: U.S. Pat. No. 5,495,245, U.S. Pat. No. 6,414,616, U.S. Pat. No. 6,567,026 and U.S. Pat. No. 7,956,786.

The DAC 100 is operable in one of three static or distinct modes. In a first mode the first stage is switchably coupled to the second stage independently of the third stage; in a second mode, the load of the third stage is coupled and presented to a first part of the second stage of circuit components and in a third mode the load of the third stage is coupled and presented to a second part of the second stage of circuit components, each of the third and second modes being presented independently of the other of the second and thirds modes. As the load from the third stage is presented to different parts of the second stage, its effect on the overall analog transfer function provided at the output 140 of the DAC will be different. The transitions between the first, second and third modes may be programmed or pre-calibrated dependent on the input codes that are provided to the DAC 100. In this way the transitions between the first, second and third modes may be ascertained from a digitally encoded DAC transfer function or from pre-programmed or pre-calibrated dependencies on the DAC input code. Such calibration may be effected through use of look-up tables, Boolean logic or synthesis optimization, or the like, as will be appreciated by those of ordinary skill in the art. Further detailed digital optimization can be used e.g. for low power or area optimization, if/as desired, as will be appreciated by those skilled in the art.

It will be understood that the heretofore illustrated three DAC stages 110, 130, 120 when coupled together provide an overall impedance to yield the target, configured output voltage level with respect to the reference terminals 111, 112. The specific coupling of individual elements from each of the three stages will vary the output voltage level and this specific coupling will depend on the input code that requires conversion. As shown in FIG. 1, the second stage 120 will also include a switching network that will operate to selectively couple a terminal of the R2 resistor string 120 to the output node 140, and the impedance contribution of the switching network is integrated into the DAC transfer function in all static or DC modes of operation.

Figure 4:
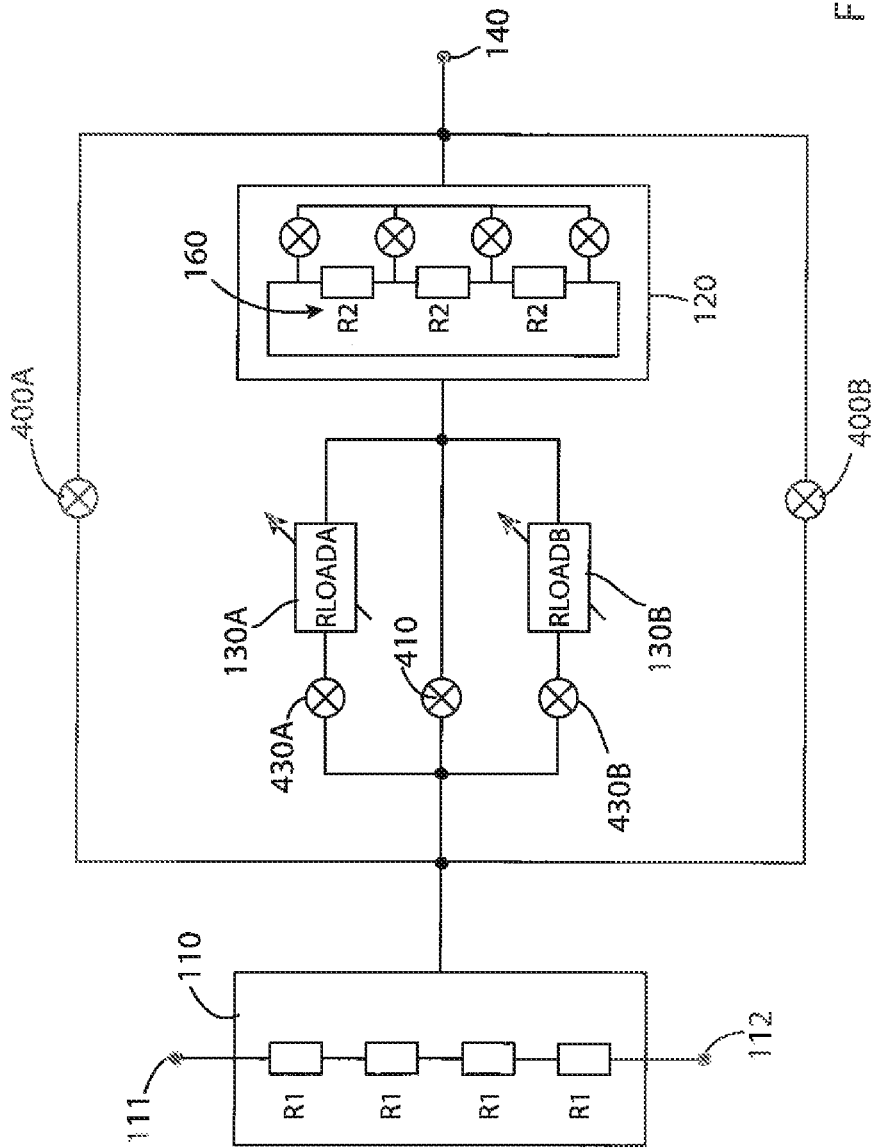
FIG. 4 is an example of further switching circuitry that may be advantageously employed to selectively provide a path from the output of the first stage to the output of the DAC.

FIG. 4 shows another variation that may be usefully employed. In this configuration it is also optionally possible to couple the nodes of the first R1 string provided by the first stage 110 to the output 140 and thereby integrate the contribution of the third stage 130 into the DAC operation in a different manner. In such a configuration the impedance elements R2 of the second stage 120 are not directly switchably coupled to the output 140, the switches shown within the block 120 are left open such that the impedance that contributes to the overall DAC transfer function is via the path defined by the switches 400. While this may provide additional flexibility it has associated disadvantages in that it requires an additional set of switches 400A, 400B coupling from the first stage 110 to the output 140.

In this exemplary configuration the switches 400A, B are used in combination with judicious switching of the switches 410, 430A, 430B, i.e. there is an intention that individual ones of these switches 410, 430A, 430B will define path such that individual ones of RLOADA, RLOADB and selected ones of the R2 string 160 will also contribute at the output 140. In a further configuration, the selected switches 410, 430A, 430B can be left open such that the voltage at the output 140 is directly and only associated with contributions from the first stage 110. It will be appreciated that the number of codes that can be converted using such a direct coupling only from the first stage is limited. Using the dual switch arrangement 400A, 400B as illustrated in FIG. 4 allows a leapfrog switching regime be implemented whereby neighbouring ones of the resistors R1 in the string of the first stage 110 can be selectively coupled to the output 140.

In another configuration, which is not shown, only one set of switches coupling the first stage 110 to the output 140 may be provided. The specifics of this switching architecture may be different to that used for the leapfrog switching used to couple odd and even ones of the R1 resistor string to the output 140 of FIG. 4.

FIGS. 5 and 6 show a variation to the third stage circuit components heretofore described. In these arrangements which similarly to FIG. 1 provide first and second switchable impedance paths to selected parts of the second stage 120 which when switched present a load to the first stage 110 of the DAC 100, the circuitry uses the same load but a different switching regime to achieve the same effect.

Figure 5A:
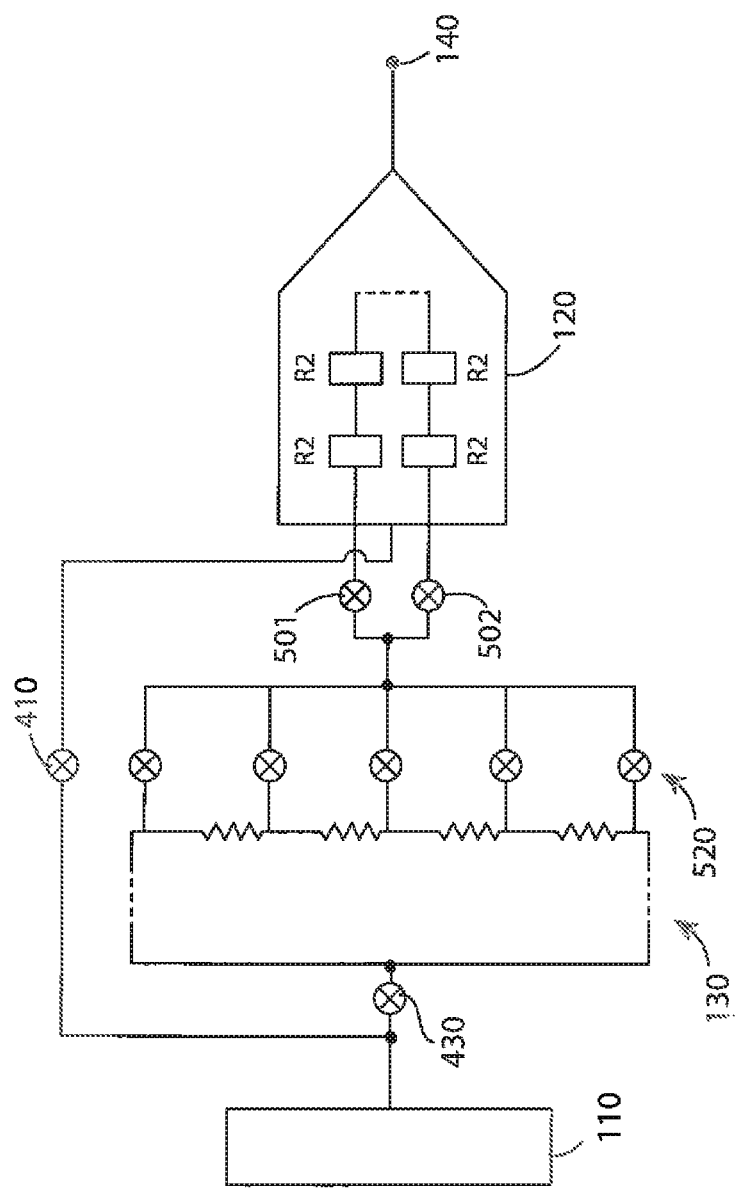
FIG. 5A is an example of circuit elements that may be usefully employed to provide a portion of the DAC circuitry of FIG. 1.

In the arrangement of FIG. 5A, which is similar to the configuration of FIG. 3 and which will be recalled as showing specifics of one arrangement for providing either of RLOADA or RLOADB, the first stage 110 is coupled to a resistor network 130 via a switch arrangement 430. This allows selected ones of the R1 resistors from the first stage to be coupled to the third stage 130.

The switches 520 allow selection of an appropriate set of resistors from the third stage 130 whereas switches 501, 502 determine which part of the second stage 120 those selected resistors are coupled to. By selectively switching individual ones of the resistors, the overall load that is provided may be varied. It will be appreciated that FIG. 5A differs from the arrangement of FIG. 3, in that an additional set of switches 501, 502 are provided which are switched in a complimentary fashion to vary which part of the second stage 120, the load of the resistor network 130 is applied to. For example, if switch 501 is closed and switch 502 left open then the load is applied to an upper part of the second stage. In the alternative where 501 is left open and 502 is closed then the load is coupled to the lower part of the second stage. It will be appreciated that the terms "upper" and "lower" are representative of the coupling shown in FIG. 5A and are not intended to limit the coupling to any specific configuration. In this regard, it will be appreciated that the circuit components of the third stage 130 can be switchably coupled to any first and second part of the second stage.

Figure 5B:
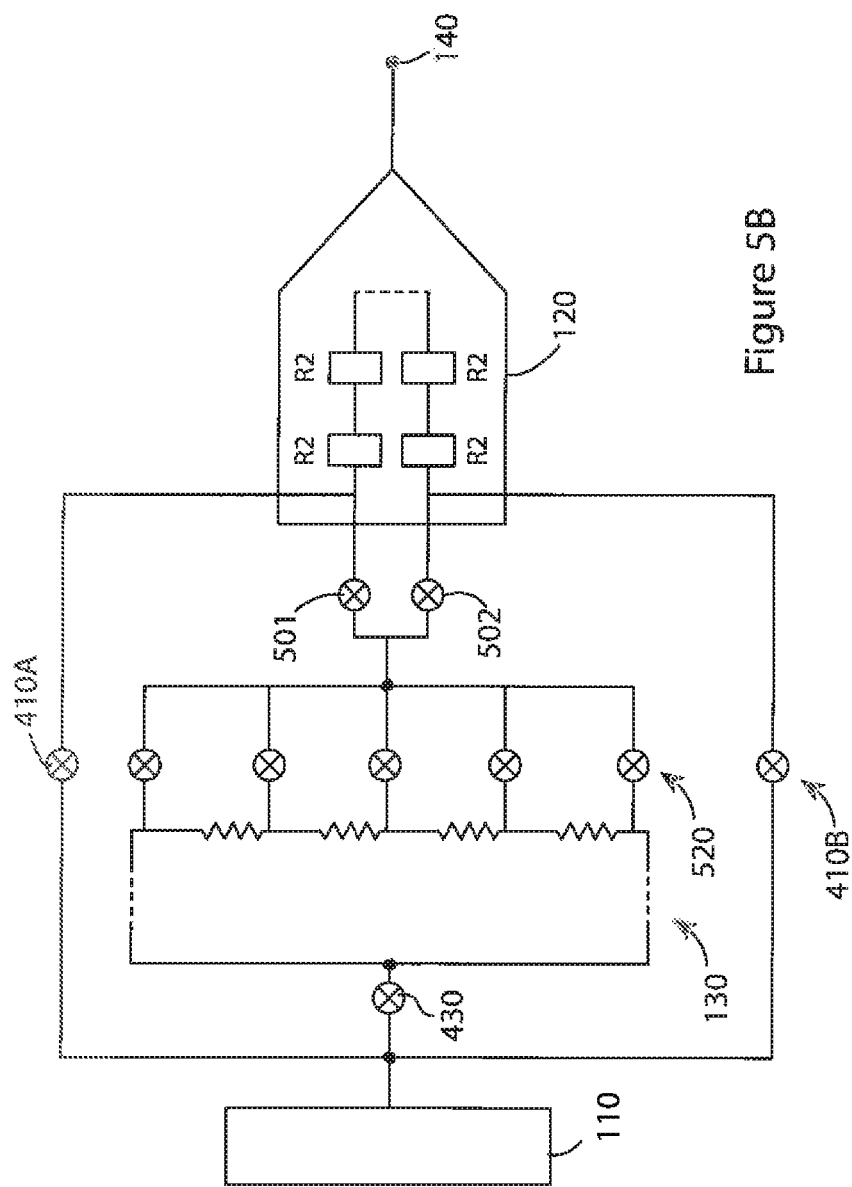
FIG. 5B is an example of circuit elements that may be usefully employed to provide a portion of the DAC circuitry of FIG. 1.

In a similar fashion and as shown in FIG. 5B, it is possible to provide first and second paths from any first and second terminals within the first stage 110 to any first and second parts of the second stage 120. In the simplified schematic of FIG. 5B this is shown as using first 410A and second 410B switches coupling the first stage 110 to first and second parts of the second stage 120.

In this configuration of FIG. 5A or 5B, the switch network 501, 502 is provided separate to the circuit elements of the resistor network that provides the load of the third stage 130. It will be appreciated that such an arrangement provides a first 520 and second 501, 502 set of switches that are switched in series with one another. The first set 520 of switches is integral to the third stage 130 and allows selective switching of individual ones of the resistor network. The second set 501, 502 is provided to then facilitate the coupling of those selected resistors to a respective location within the second stage 120.

In an alternative arrangement, shown in FIG. 6, first 601 and second 602 sets of switches are provided, with each of the first and second set of switches allowing selection of individual ones of the resistors of the resistor network within the third stage 130. Each of the set of switches may be considered a multiplexer as they allow selection of individual ones of the resistors of the resistor network to be coupled together to provide an output load to the second stage 120. In effect this configuration provides a dual multiplexing function where the switches 601, 602 provide a digital potentiometer sometimes referred to as a digiPOT, function where it facilitates the switching of selected resistors within the third stage 130 to the second stage 120 and also provides for a selection of individual ones of the resistors R2 within the second stage 120.

In a similar fashion to that described above, using the switch arrangement 430 it is possible to vary which selected ones of the R1 resistors from the first stage are coupled to the third stage 130.

Figure 6A:
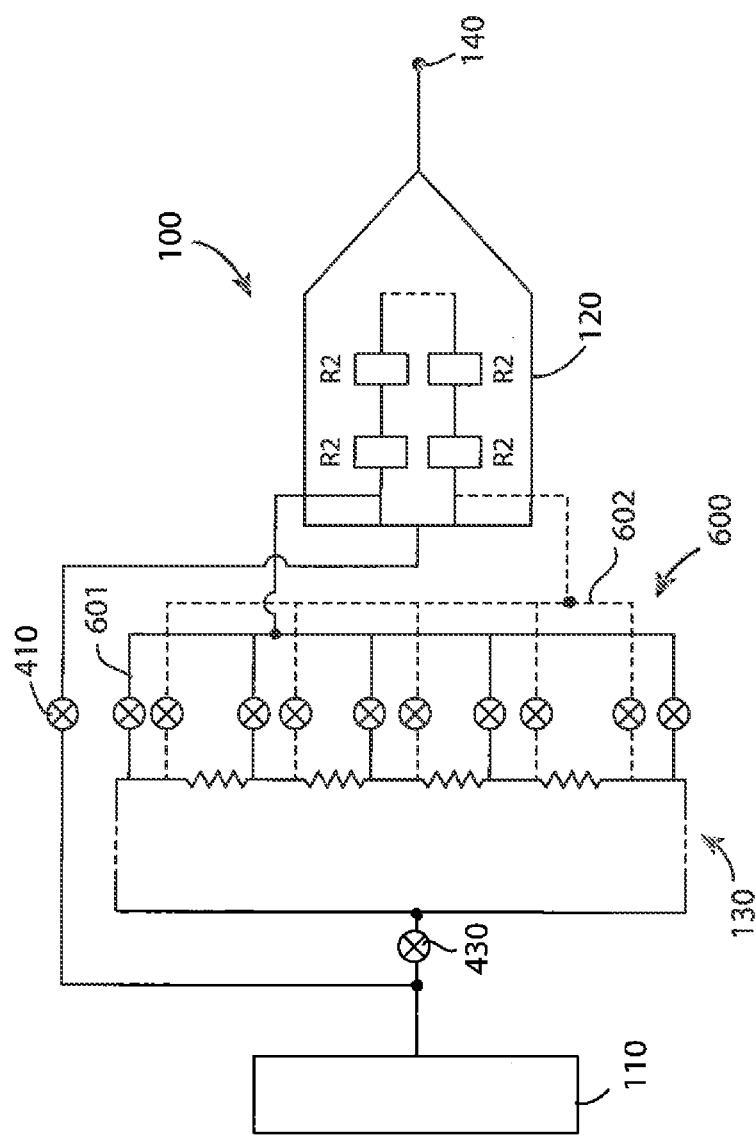
FIG. 6A is an example of other types of circuit elements that may be usefully employed to provide a portion of the DAC circuitry of FIG. 1.

It will be appreciated that in the schematic of FIG. 6A (and also FIG. 6B), that the impedance elements within the third stage 130 are shown as a single string. It will be appreciated that this single string implementation is provided for ease of explanation and equally it may be desirable to use multi-stage digital rheostat to reduce the number of switches. It will be understood that this also facilitates an implementation where the last stage has a low resolution which consequently facilitates a reduction in the number of switches required between the third stage 130 and the second stage 120.

In this way the third stage-which will be recalled from the above discussion as being provided in one aspect of the present teaching by a digital potentiometer, will include a resistor network coupled to a first 601 and second multiplexer 602 arrangement providing an overall dual multiplexer 600. By using either the first 601 or second 602 multiplexer, it is possible to provide the load from the third stage to specific parts of the second stage 120. In the schematic of FIG. 6A, the hard line of the switches 601 represents an activation of that set of switches so as to provide the load to the upper part of the second stage 120. In an alternative configuration where there is a desire to couple the load to the lower part, the first set of switches 601 would be deactivated and selected ones of the second set of switches 602 activated.

Figure 6B:
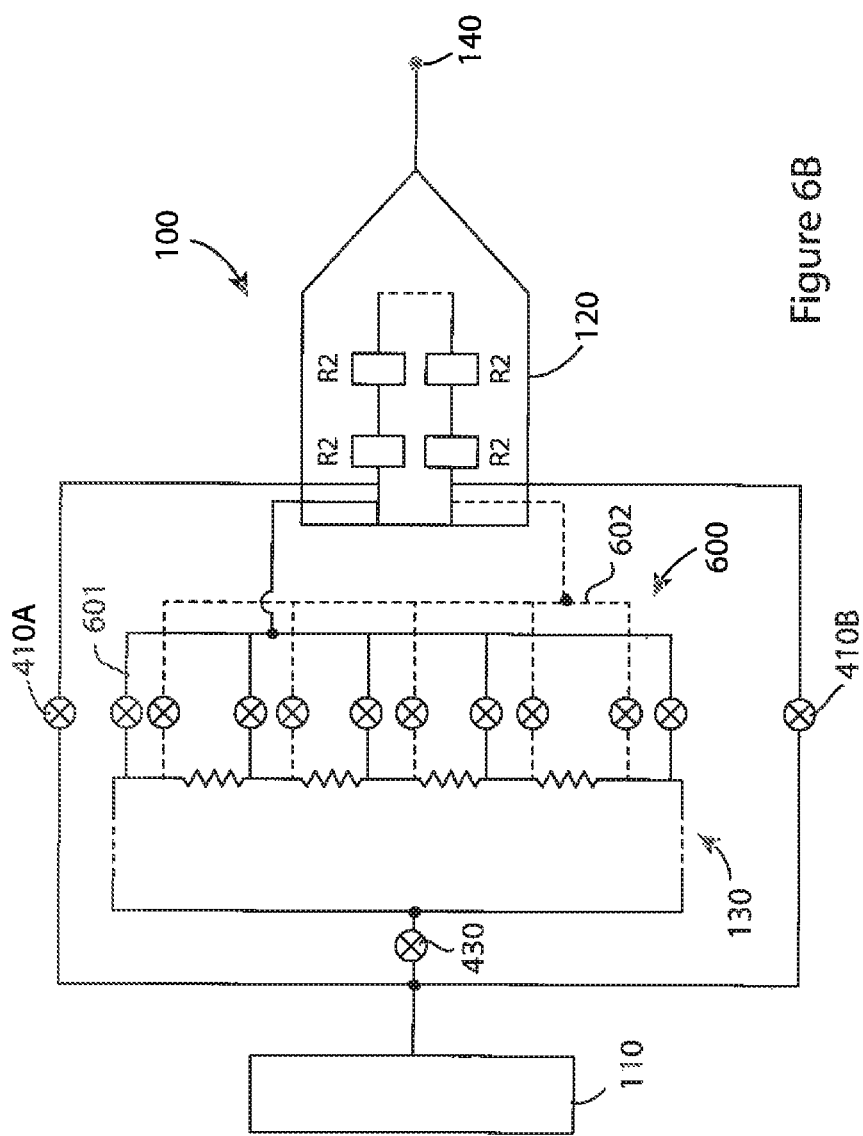
FIG. 6B is an example of other types of circuit elements that may be usefully employed to provide a portion of the DAC circuitry of FIG. 1.

In a similar fashion to this arrangement, and also to that shown in FIG. 5B, as shown in FIG. 6B, it is possible to provide first and second paths between the first stage 110 and the second stage 120 via first 410A and second 410B switches to allow a coupling of the first stage 110 to any first part or second part of the second stage 120.

It will be appreciated that where the third stage comprises a single switchable resistor network coupled to the first stage via a single multiplexer 430—per FIG. 5 or FIG. 6—that first and second switched outputs of the third stage are used to couple the single switchable resistor network of the third stage to the second stage, that the specifics of the switching network provided will vary as the specifics of a switching architecture that is used for the leapfrog switching to couple odd and even ones of the R1 resistor string to the output 140 will be different to a switching network that is used to simply couple selected ones of the resistors within the first stage 110 to the output 140.

While not described in detail it will be appreciated that the switches themselves will contribute an impedance, as will any parasitic circuit and/or interconnect impedance, and that these impedances will contribute to the overall impedance of the DAC architecture during any one specific switching regime. The person of ordinary skill will appreciate that these secondary impedances will need to be considered in determining the overall impedance of the network and these parameters will be determined during circuit design and simulation.

It will be appreciated that such programming of the DAC may effect a sequential activation of each of the modes of operation in a leap frog arrangement such that for each impedance element in the first stage a switching regime is effected to sequentially activate the first, second and third modes when incrementing or decrementing the DAC input code.

An example of such a switching regime is evident from an inspection of FIGS. 2A, 2B, 2C, 2D and 2E which are described with reference to the circuitry of FIG. 1 which described the use of two distinct loads RLOADA and RLOADB. It will be appreciated that using a shared load but different switching paths of FIG. 5 or 6 that an equivalent set of schematics showing judicious selection of either the first, second or third mode could be generated. For the sake of brevity herein, these schematics are not provided.

Figure 2A:
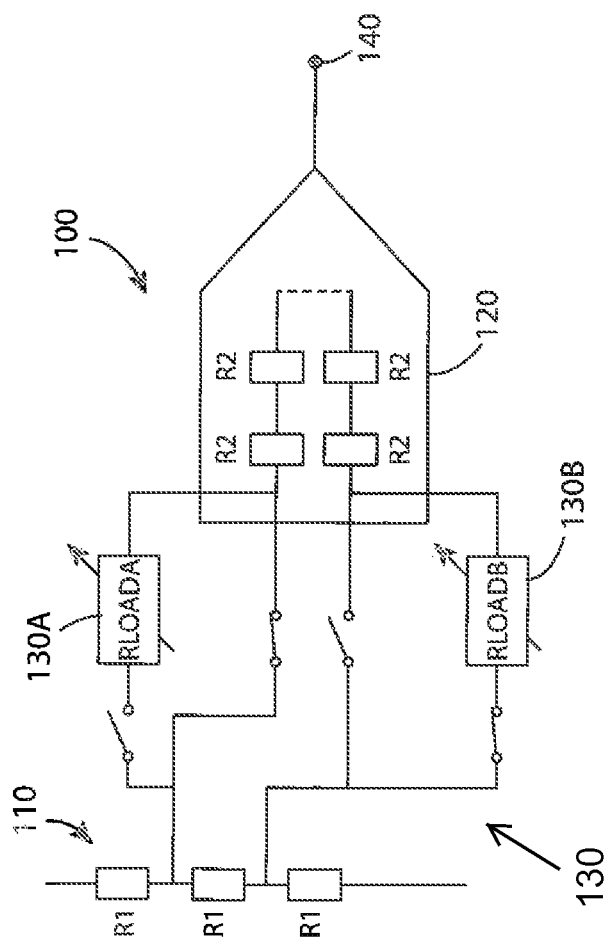
FIG. 2A is a block architecture showing additional detail to the specific of FIG. 1 in a first switching arrangement illustrating a third mode of operation of the DAC.

In FIG. 2A, the DAC is in the third mode whereby the output voltage provided at 140 has contributions from each of R1, R2 and RLOADB. This is achieved by switching RLOADB in series with the R2 network from the R1 network.

Figure 2B:
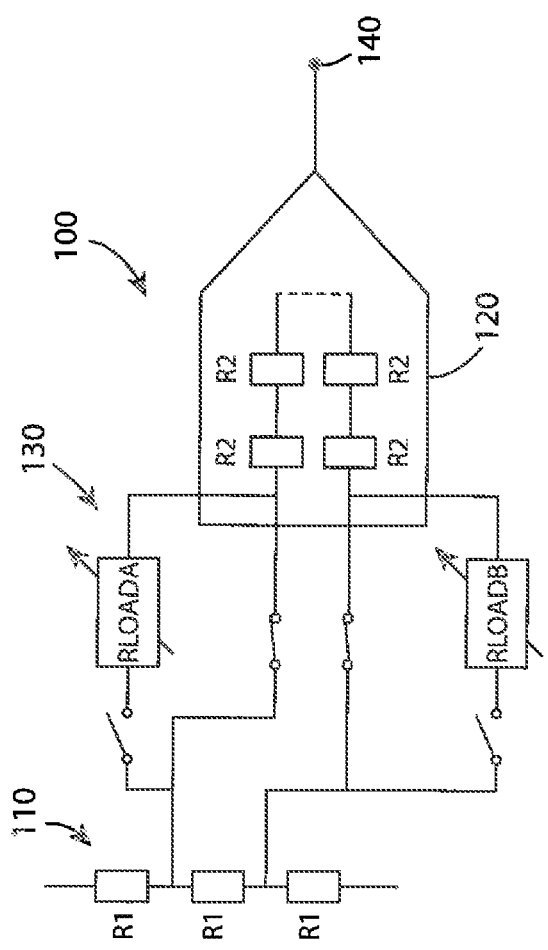
FIG. 2B is a block architecture showing additional detail to the specific of FIG. 1 in a second switching arrangement showing a first mode of operation of the DAC.

In FIG. 2B, each of RLOADA and RLOADB are not switched into the network such that the voltage at the output 140 is directly from the contribution of each of the R1 and R2 impedance networks. This represents the first mode of operation of the DAC 100 as the first stage is switchably coupled to the second stage with substantially no DC contribution from the loads RLOADA, RLOADB of the third stage.

Figure 2C:
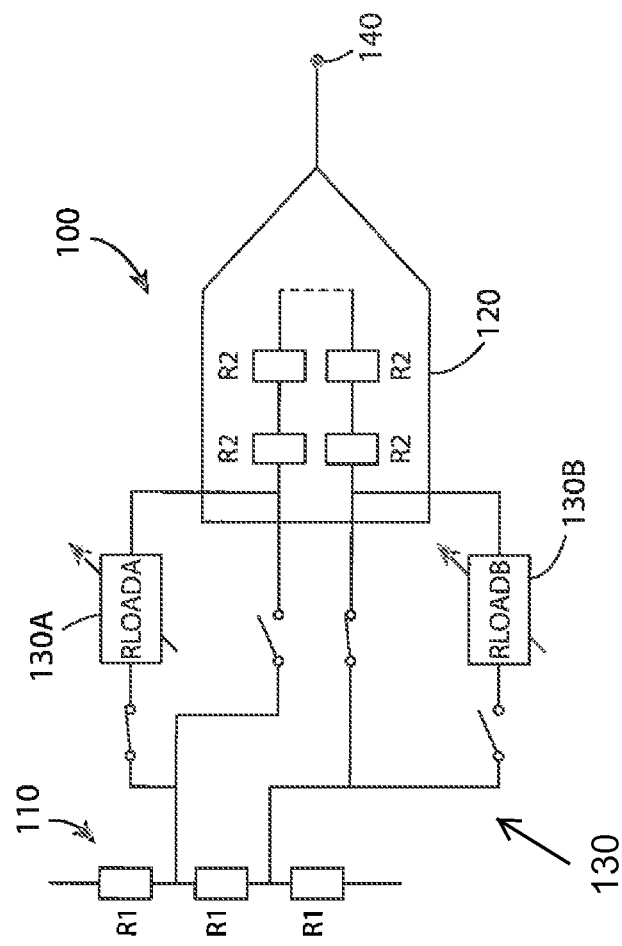
FIG. 2C is a block architecture showing additional detail to the specific of FIG. 1 in a third switching arrangement showing a second mode of operation of the DAC.

In FIG. 2C, the second mode of operation is exemplefied. In this configuration the output voltage provided at 140 has contributions from each of R1, R2 and RLOADA.

Figure 2D:
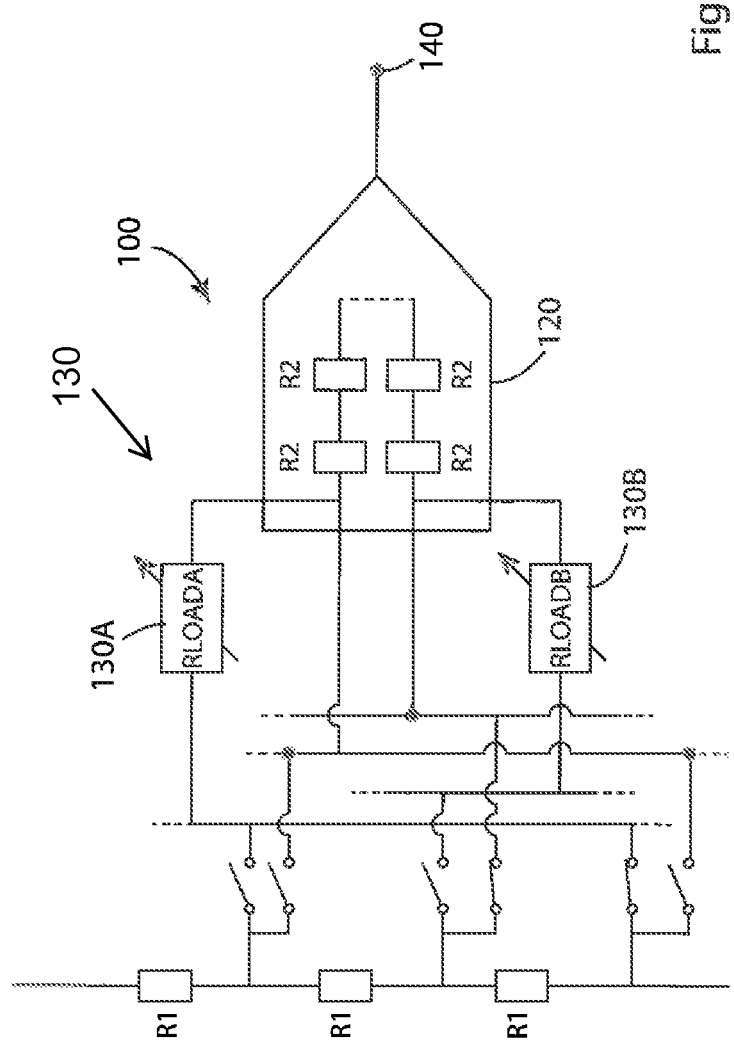
FIG. 2D is a block architecture showing additional detail to the specific of FIG. 1 in a fourth switching arrangement showing a second mode of operation of the DAC.

In FIG. 2D, the load RLOADA is coupled to an alternative one of the R1 impedance elements representing a leap frog configuration whereby the RLOADA is switchably coupled to the lower side of the lowest shown resistor R1 of the first stage to which the R2 string is coupled. This leap frog along the R1 string can be implemented for each of RLOADA and RLOADB at various transitions provided for selected DAC input codes. It will be appreciated that in such a leapfrog configuration that there are two switches provided for each node of the R1 string and that judicious selection of individual ones of these switches can couple in the third stage load or provide a direct DAC path between the first 110 and second stages 120.

Figure 2E:
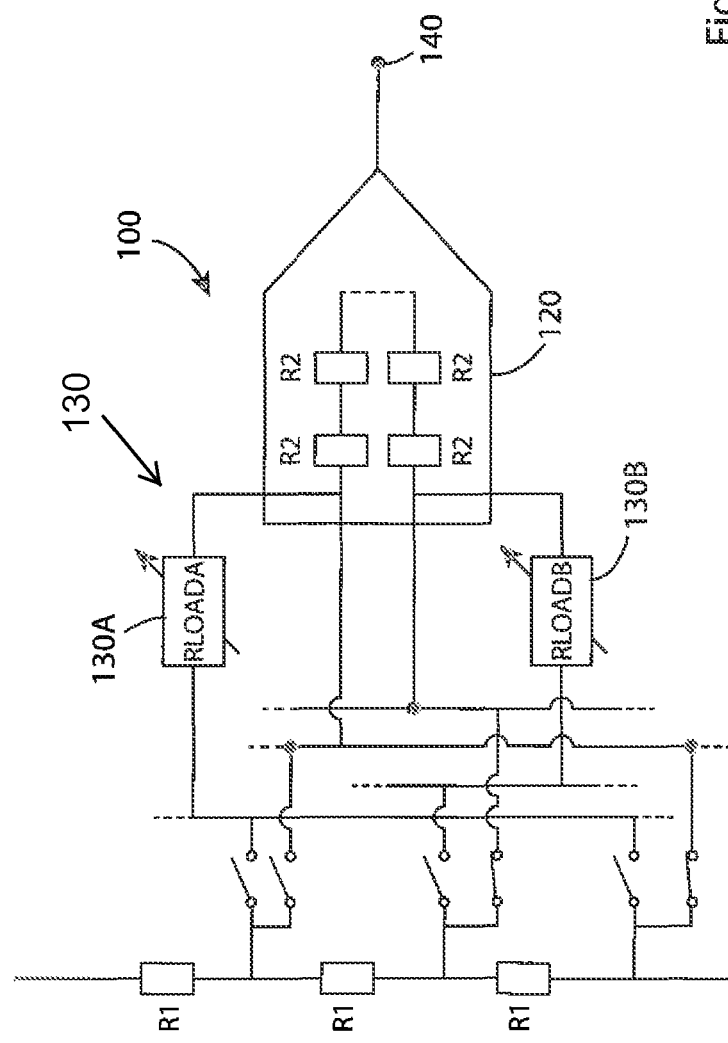
FIG. 2E is a block architecture showing additional detail to the specific of FIG. 1 in a fifth switching arrangement showing a first mode of operation of the DAC where an upper part of the R2 string is now coupled to a neighbouring resistor to that shown in FIG. 2B illustrating a leap frog switching arrangement.

In FIG. 2E, each of RLOADA and RLOADB are switched out and, representing the adoption of the first mode again, similar to that described with reference to FIG. 2B. However, the switching configuration of R1 to R2 is varied by leapfrogging along the R1 string such that the upper part of the R2 network is now coupled to the lower part of the lowest shown resistor R1 to which lower part of the R2 string is coupled—see for comparison the switching regime illustrated in FIG. 2B. This allows the contribution of neighbouring resistors from the first stage to be sequentially used in providing conversion of specific DAC input codes, per a leapfrog switching regime. It will be appreciated that use of leap frog switching advantageously allows a reduction in the number of DAC switches required.

It will be appreciated that the sequence of switching provided by each of FIGS. 2A to 2E represents the type of switching regime that is used to facilitate a decrement of the DAC from an initial coupling to the top of the second stage 120 in FIG. 2A to the bottom of the same stage in FIG. 2C. In FIG. 2D, the RLOADA string is coupled in parallel with the bottom resistor R1 of the first stage, flipping over the R2 string and demonstrating a leap frog implementation. It will be appreciated from an inspection of FIGS. 2C and 2D that on transition from coupling a first impedance element of the first stage to the second stage to coupling a second impedance element in the first stage to the second stage that the existing second mode of operation is maintained as RLOADA continues to be presented to the first stage, albeit to a different impedance element of that first stage. It will be appreciated that while this illustrates the use of RLOADA, that similar leapfrogging can be used for RLOADB and that the leapfrogging from RLOADA or RLOADB to the elements of the first stage will typically be implemented for alternative ones of the elements of the first stage.

A continuation of this leap frog switching is shown in FIG. 2E whereby a switching of the second stage 120 is effected to allow selection of neighbouring resistors from the first stage 110.

Examination of the sequence shown from FIG. 2B to FIG. 2E shows how successive resistors of the first string 110 can be coupled into the overall DAC network to provide successive DAC transfer function changes.

While exemplified with reference to a leap frog switching regime, it will be appreciated that other types of switching regimes could also be implemented. For example, it is possible to use provide a switching that does not require such a complex flip-over or leapfrog switching methodology.

It will be appreciated that the arrangement of the individual stages of the multiple stage architecture per the present teaching maintains an intrinsic monotonicity that is usually associated with a single string architecture. The use of the switching regime illustrated herein can provide, in the absence of circuit malfunction or defect, a monotonic transfer function characteristic.

While described above in the context of a three stage DAC, additional stages can be added to the overall DAC network and as each additional stage is added to the network the number of impedance elements in the successive strings may be reduced. As the first string defined within the first stage dominates the power consumption and provides a key part of the precision of the DAC, it will typically include a larger number of impedance elements as compared to successive stages. Ultimately, if sufficient numbers of stages are added, the number of impedance elements can be minimized.

The reference terminals are typically coupled to the first string 110 and are typically coupled to a voltage source. As will be appreciated by those skilled in the art the term voltage source is intended to define and include an active voltage supply, a voltage buffer or a current source which is coupled to other circuit elements and configured to provide a target voltage. Within this general definition it will be appreciated that the present teaching should not be limited to any one specific configuration and hence the use of the term reference terminal. It will be further understood that where the reference terminals are driven by voltage sources/buffers/followers or coupled to passive, active or switched networks that these could be implemented as a sub-part of a high-level circuit and the present teaching is not intended to be limited to any one specific implementation.

To provide a digital to analog conversion such DAC circuits provide for a judicious switching of the individual impedance elements to provide a corresponding analog output for an input digital code. It is evident and known to those of skill in the art that the switching networks that are used to couple individual impedance elements also contribute impedance in the overall DAC network.

Optimisation of the DAC can be achieved in a number of different ways; for example parasitic impedance and other layout dependent effects (LDEs) can be integrated into the optimization and the switch circuit may include for example a series resistance element of the same type of resistor or resistance material as R1 and/or R2. Any further developments in terms of the controlled impedance switch design can be used here also.

In an exemplary implementation of the third stage as a digital potentiometer—as described above—resistance elements used in the third stage will typically be of the same type as used in the first and second stages so that all three stages variances arising from resistors, e.g. process and temperature variations, are correlated and match each other. This variation matching or tracking is achieved using circuit and layout design practice known to those skilled in the art.

It will be understood that where the elements or devices that are used to fabricate the individual strings of the DAC are described with reference to resistors having a resistance that these are specific examples of impedance elements each having an associated impedance. The present teaching is not to be construed as being limited to resistors and resistance and other examples of impedance elements may be used within the overall context of the present teaching. For example, current sources or sinks can be used with the DAC network but it will be appreciated that the use of passive impedances per the exemplary arrangements above advantageously yield a ratiometric design and thereby has reduced sensitivity to voltage to current and back to voltage conversion error sources.

It will be appreciated that the present teaching describes MOS switches for the operation of the exemplary circuits described. However it will be understood that the operation of the present teaching is not limited to MOS switches and can be employed using Junction Field Effect Transistors (JFET) switches, Metal Semiconductor FET (MESFET), High Electron Mobility Transistors (HEMT), Micro-Electro-Mechanical Systems (MEMS) switches or any other switching scheme used in converters. Furthermore, it will be appreciated that MOS devices are not manufactured using metal-oxide-semiconductor construction in modern technologies but this is the conventional term used to describe generically modern "CMOS processes" including those implemented using poly gate, metal gate and non-oxide insulation layer. It will be further appreciated that where MOS switches are used that these switches do not have to be implemented as transmission gates or single MOS device switches as many other switch implementations and configurations including reverse body biasing, forward body biasing, adaptive biasing and other switch design techniques known to those skilled in the art may also be used as appropriate.

Other embodiments are within the spirit and scope of the appended claims. For example, due to manufacturing variances and second order non-ideal conditions, the nominal values of R1, R2 and contributions from the switching network and parasitic impedances may be adjusted to give optimum results. Monte Carlo analysis, other statistical analysis or analog design optimization tools and methodologies may be used to perform this optimization. For example. for each node coupled from the first stage 110 to the second stage, parasitic elements associated with the direct path 410 and corresponding paths incorporating the third, series load, stage are desirably matched. This can include both the switching circuitry and parasitic interconnect impedances. This can be captured and verified in simulations incorporating layout parasitic elements, termed layout simulations. Further, various technologies may be used for the switches, such as CMOS transmission gates, one MOS transistor type (e.g., NMOS or PMOS), either of the above with a single, or plurality of, series resistors on one or both sides of the switch. Still further, two parallel resistor strings may be used.

While the present teaching has been described heretofore with reference to specific examples of conventional binary numbering arrangements as these represent commonly favoured and widely used implementations. However the present teaching should not be construed as being limited to such implementations as the teaching has application in non-binary base arrangements or different numbering systems such as for example relative primes.

Within the context of the present teaching the overall DAC resolution is a combination of the individual contributions by each of the stages. In the context of providing a binary DAC resolution one or more of the individual stages may provide a non-binary contribution. The number of states provided by a DAC architecture in accordance with the present teaching can be equal to or greater than that actually required and this may prove useful in circuit or system optimisation.

Where the present teaching describes specific features or elements with reference to one particular figure, it will be appreciated that those features or elements could be used with other features or elements without departing from the spirit or scope of the claimed teaching.

The words "comprises/comprising" and the words "having/including" when used herein with reference to the present specification are used to specify the presence of stated features, integers, steps or components but does not preclude the presence or addition of one or more other features, integers, steps, components or groups thereof.

The present teaching is not limited to the embodiments hereinbefore described but may be varied in both construction and detail.

The invention claimed is:

1. A multi-stage Digital to Analog Convertor (DAC) comprising:
   a first stage comprising a first set of circuit components,
   a second stage comprising a second set of circuit components and
   a third stage comprising a third set of circuit components, the third stage providing a load within first and second individual switchable impedance paths;
   wherein the DAC is operable in each of a first mode, a second mode and a third mode of operation, wherein in the first mode the first stage is switchably coupled to the second stage independently of the third stage; in the second mode, the load is coupled and presented to a first part of the second stage of circuit components and in the third mode the load is coupled and presented to a second, different, part of the second stage of circuit components.

2. The DAC of claim 1 wherein the load comprises a first variable resistor.

3. The DAC of claim 1 wherein the load comprises a digitally variable impedance element.

4. The DAC of claim 1 further comprising a multiplexer configured to selectively couple the load the second stage of circuit components.

5. The DAC of claim 4 wherein the multiplexer defines first and second switchable paths from the load to the second stage of circuit components.

6. The DAC of claim 4 wherein the third stage comprises a digital rheostat, the multiplexer being a component of the digital rheostat.

7. The DAC of claim 4 wherein the third stage comprises a first multiplexer and a second multiplexer, operable selection of either the first multiplexer or the second multiplexer providing the first and second individual switchable impedance paths.

8. The DAC of claim 1 further comprising a set of switches arranged in series with the load to selectively couple the load to the second stage.

9. The DAC of claim 1 wherein the third stage comprises a first load and a second load, each of the first load and second load being presented independently of the other of the second and first load to the second stage of circuit components.

10. The DAC of claim 9 wherein each of the first load and the second load comprises a variable resistor.

11. The DAC of claim 10 wherein resistances of each of the first and second variable resistors have overlapping impedance ranges.

12. The DAC of claim 9 wherein at least one of the first load and the second load comprises a digitally variable impedance element.

13. The DAC of claim 12 wherein each of the first load and the second load comprises a digitally variable impedance element.

14. The DAC of claim 1 wherein the load is provided by a resistor network comprising a plurality of resistors that are individually switchable to define both Most Significant Bit, MSB, and Least Significant Bit, LSB transitions within the DAC.

15. The DAC of claim 1 wherein the third stage is configured to provide each of a high resolution path and a low resolution path from the first stage to an output of the DAC.

16. The DAC of claim 1 wherein the third stage comprises a programmable resistance network providing a plurality of individual switchable impedance paths.

17. The DAC of claim 16 wherein the programmable resistance network is configured to be digitally controlled.

18. The DAC of claim 1 wherein the DAC is configured to activate each of the modes of operation in a leap frog arrangement such that for each impedance element in the first stage a switching regime is effected to activate the first, second and third modes.

19. The DAC of claim 18 configured such that on transition from coupling a first impedance element of the first stage to the second stage to sequentially coupling a second impedance element in the first stage to the second stage that the existing mode is maintained.

20. A method of converting a digital input code to an analog equivalent, the method comprising
   Providing a multi-stage Digital to Analog Convertor, DAC, comprising a first stage comprising a first set of circuit components, a second stage comprising a second set of circuit components and a third stage comprising a third set of circuit components, the third stage providing a load within first and second individual switchable impedance paths;
   Operating the DAC in each of a distinct first mode, a second mode and a third mode of operation, wherein in a first mode the first stage is switchably coupled to the second stage independently of the third stage; in a second mode, the load is coupled and presented to a first part of the second stage of circuit components and in a third mode the load is coupled and presented to a second, different, part of the second stage of circuit components.

21. The method of claim 20 further comprising analysing the digital input code and in response to the analysis of the digital input code selecting one of the first mode, second mode, and third mode.

22. The method of claim 21 wherein the analysing the digital input code comprises determining transitions from each of the first mode, the second mode and the third mode to others of the first mode, second mode and third mode.

23. The method of claim 22 wherein the first stage comprises a plurality of impedance elements provided in a string arrangement and the determining transitions comprises effecting a leapfrog switching regime.

24. The method of claim 22 wherein the determining the transitions from each of the first mode, the second mode and the third mode to others of the first mode, second mode and third mode is ascertained from a digitally encoded DAC transfer function.

25. The method of claim 20 comprising providing a set of switches and using the set of switches to effect a switching of the load within the third stage and concurrently also to effect a switching of individual impedance elements within the second stage.

26. A digital to analog converter circuit, comprising:
a first stage comprising a first set of circuitry means, a second stage comprising a second set of circuitry means and a third stage comprising a third set of circuitry means, the third stage providing a load within first and second individual switchable impedance means;
means for operating the DAC in each of a first mode, a second mode and a third mode of operation, wherein in a first mode the first stage is coupled via switchable coupling means to the second stage independently of the third stage; in a second mode, the load is coupled via coupling means and presented to a first part of the second stage of circuitry means, and in a third mode the load is coupled and presented to a second, different, part of the second stage of circuitry means.

* * * * *